United States Patent [19]

Kawakami

[11] Patent Number: 5,277,786
[45] Date of Patent: Jan. 11, 1994

[54] PROCESS FOR PRODUCING A DEFECT-FREE PHOTOELECTRIC CONVERSION DEVICE

[75] Inventor: Soichiro Kawakami, Hikone, Japan

[73] Assignee: Canon Kabushiki Kaisha, Tokyo, Japan

[21] Appl. No.: 836,709

[22] Filed: Feb. 19, 1992

[30] Foreign Application Priority Data

Feb. 20, 1991 [JP] Japan .................................. 3-045587

[51] Int. Cl.⁵ ..................... H01L 31/18; C25D 5/02
[52] U.S. Cl. ..................................... 205/124; 136/258;
136/265; 136/290; 205/157; 205/219; 205/317;
204/129.1; 437/2; 437/4; 437/5; 437/170;
437/228; 437/235; 437/243; 437/923
[58] Field of Search .................... 437/2-5; 170;
228, 235, 243-244, 423; 204/129.1;
205/121, 123-124; 157, 219,
316, 317; 136/290, 258, 265

[56] References Cited

U.S. PATENT DOCUMENTS 4,451,970 6/1984 Izu et al. ..................................... 437/8

FOREIGN PATENT DOCUMENTS 60-85578 5/1985 Japan ..................................... 136/290

OTHER PUBLICATIONS

M. Matsumara et al, *J. Appl. Phys.*, vol. 61, No. 4, Feb. 1987, pp. 1648-1649.

*Primary Examiner*—Aaron Weisstuch
*Attorney, Agent, or Firm*—Fitzpatrick, Cella, Harper & Scinto

[57] ABSTRACT

A process for producing a photoelectric conversion device comprising a substrate having a conductive surface, a semiconductor layer disposed on said conductive surface of said substrate, a transparent and conductive layer disposed on said semiconductor layer and a collecting electrode disposed on said transparent and conductive layer, wherein one or more defective portions formed at the semiconductor layer are repaired by means of electrolytic treatment using an electrolytic solution containing a material capable of providing an insulating material, wherein the conductive surface of the substrate is made an electrode, to thereby deposit an insulating material selectively at each of the defective portions.

4 Claims, 8 Drawing Sheets

PROCESS FOR PRODUCING A DEFECT-FREE PHOTOELECTRIC CONVERSION DEVICE

BACKGROUND OF THE INVENTION

1. Field of the Invention

The present invention relates to a process for producing a defect-free photoelectric conversion device. More particularly, the present invention relates to an improved process for producing a defect-free photoelectric conversion device such as a solar cell, photosensor, etc. while repairing a defective portion such as pinhole, hillock, or the like, which occurred during the preparation thereof.

2. Related Background Art

In recent years, various studies have been made of large area photoelectric conversion devices such as solar cells, photosensors, electrophotographic photosensitive devices, flat panel displays, etc. Attention has been focused on non-single crystal semiconductors such as amorphous silicon semiconductors to constitute these large area semiconductor devices mainly because of their reasonable production cost.

For instance, there is known a pin junction type amorphous silicon solar cell as an example of such non-single crystal semiconductor device. In this solar cell, photocarriers are created in its semiconductor layer comprising an amorphous silicon semiconductor thin film when light impinges the solar cell. The photocarriers migrate to a transparent electrode comprising a transparent conductive thin film situated on the side through which light is impinged and also to a conductive substrate situated opposite the transparent electrode by the action of an internal electric field, to thereby provide a photoelectromotive force.

The conductive thin film forming the transparent electrode and the semiconductor thin film forming the semiconductor layer may be formed in a vacuum chamber in accordance with a plasma CVD method, a photo CVD method, a thermal CVD method, a vacuum evaporation method, or a sputtering method.

In the preparation of such amorphous silicon solar cell, there is often found a problem that a short circuit occurs between the transparent electrode and the conductive substrate due to pinholes formed at parts of the semiconductor layer.

There are various causes for such pinholes to be formed. For instance, in one case, since the transparent electrode is usually some hundreds of angstroms in thickness and the semiconductor layer is usually about 0.005 to some tens of μm thick, minute dust particles (some micrometers to some tens of micrometers in size) are deposited on the surface of the conductive substrate or they are deposited on or contaminate the semiconductor layer during film formation, whereby pinholes are formed in the semiconductor layer.

In another case, pinholes are formed when part of the semiconductor layer is lost due to its internal stress or its insufficient adhesion with the transparent electrode. In this case, the transparent electrode situated on the side through which light is impinged and the conductive substrate situated opposite said electrode are connected with each other through said region to be in an electrically short-circuited state, and because of this, the result has extremely poor characteristics as a semiconductor device.

The occurrence of pinholes causing a short circuit is a serious problem particularly in the case of a large area photoelectric conversion device such as a solar cell, electrophotographic photosensitive device, etc. In any case, it is extremely difficult to obtain a large area photoelectric conversion device completely free of a short-circuited region even under a clean environment substantially free of minute dust particles.

In order to solve the above problem relative to occurrence of pinholes causing a short circuit, Japanese Patent Publication 62(1987)-53958 (hereinafter referred to as Literature 1) proposes a method of making the inside of each of the pinholes formed in the thin film semiconductor layer of a photosemiconductor to be in an electrically insulating state by perforating the electrode layer at the pinholes and communicating the pinholes of the thin film semiconductor layer with the pinholes of the electrode layer. Similarly, Japanese Patent Publication 62(1987)-59901 (hereinafter referred to as Literature 2) proposes a method of obviating pinholes formed in the thin film semiconductor layer of a semiconductor device by fusing the peripheries of the pinholes with radiation of energy beam.

FIGS. 10(a) and 10(b) are schematic views for explaining the method according to Literature 1.

In FIGS. 10(a) and 10(b), reference numeral 1 indicates a translucent substrate, reference numeral 2 indicates a translucent electrode layer, reference numeral 3 indicates a semiconductor layer comprising a thin semiconductor film, reference numeral 4 indicates a back electrode layer, reference numeral 5 indicates a pinhole in a short-circuited state, reference numeral 6 indicates a pinhole provided at the back electrode layer, reference numeral 7 indicates a laser beam, and reference numeral 8 indicates another laser beam.

The method according to Literature 1 will be explained with reference to FIGS. 10(a) and 10(b). That is, after a plurality of semiconductor devices have been prepared, the semiconductor devices which are defective because of short circuits are sorted out. As for each of those defective semiconductor devices, beam scanning is performed while irradiating laser beam 7 through the other principal face of the translucent substrate as shown in FIG. 10(a). When the short circuit current is measured for the semiconductor device at the time of performing the beam scanning, short circuit current does not flow when the laser beam 7 is irradiated to the portion where a pinhole 5 in a short-circuited state is present. On the other hand, upon irradiating the laser beam 7 to other portions where such short-circuited state is not present, hole-electron pairs are created and they migrate in the semiconductor layer 3, whereby current flows. In view of this, the position where a pinhole 5 is present can be found for the semiconductor device by performing beam scanning using the laser beam 7.

As for the portion of the semiconductor layer where a pinhole 5 is present, the laser beam outputted from a YAG pulsed laser of $5 \times 10^6$ W/cm$^2$ peak output power is radiated through the back electrode layer 4 as shown by arrow 8 to thereby remove a short-circuited region comprising the material of the back electrode layer 4 which extends to the inside of the pinhole 5. Particularly, as shown in FIG. 10(b), a pinhole 6 is formed at the back electrode layer 4 such that it is coaxially in communication with the pinhole 5, whereby the inside of the pinhole 5 and that of the pinhole 6 are in an electrically insulating state.

FIGS. 10(c), 10(d), and 10(e) are schematic views for explaining the method according to Literature 2.

In FIGS. 10(c), 10(d), and 10(e), reference numeral 1 indicates a translucent substrate, reference numeral 2 indicates a translucent electrode layer, reference numeral 3 indicates a semiconductor layer comprising a thin semiconductor film, reference numeral 4 indicates a back electrode layer, reference numeral 5 indicates a pinhole in a short-circuited state, reference numeral reference 7 indicates a laser beam, and reference numeral 9 indicates a photosensor.

Translucent electrode 2 is formed on a translucent substrate 1 and then, a thin film semiconductor layer 3 is formed on the translucent electrode 2. As for the device thus obtained, beam scanning is performed on the semiconductor layer 3 by irradiating laser beam 7 from an Ar gas laser of an extremely low output power through the rear side of the semiconductor layer 3 and moving a photosensor 9 arranged on the side of the translucent substrate 1 opposite the Ar gas laser, in synchronism with the scanning of the laser beam 7, as shown in FIG. 10(c), to thereby determine whether or not the semiconductor layer 3 contains a pinhole 5. In this case, if such pinhole 5 is not present at the portion of the semiconductor layer 3 where the laser beam 7 is irradiated, the laser beam 7 is absorbed by the semiconductor 3 and does not reach the photosensor 9. On the other hand, if such pinhole 5 is present at the portion of the semiconductor layer 3 where the laser beam 7 is irradiated, the laser beam 7 reaches the photosensor 9, and based on a signal outputted from the photosensor 9 at that time, the position where the pinhole 5 is present is detected.

When the presence of the pinhole 5 is optically detected as above described, a laser beam of about 2 to 3 W/cm$^2$ in power outputted from, for example, an Ar gas laser of 514.5 nm wavelength instead of the laser beam 7 is irradiated to the portion where the pinhole 5 is present, to thereby fuse the peripheries of the pinhole 5 with respect to the semiconductor layer 3, whereby the pinhole 5 is filled with the material of the semiconductor layer 3, as shown in FIG. 10(d). The filled portion of the semiconductor layer 3 is initially in a fused state but it is eventually cooled, wherein the material of the filled portion is changed from an amorphous state to a polycrystalline state or the like and the photoelectric junction is broken. Thus, the filled portion functions substantially as an insulator.

Finally, as shown in FIG. 10(e), a 2,000 to 10,000 Å thick aluminum layer as a back electrode 4 is laminated on the semiconductor layer 3 having the above portion filled by a vacuum evaporation technique.

The above-mentioned methods are effective in order to solve the foregoing problems relative to short circuits caused by pinholes formed in the semiconductor layer to a certain extent, but there still exist such problems as will be mentioned below, which are necessary to be solved.

In the case of the method according to Literature 1, there is a problem that it takes a long period of time in order to detect a number of pinholes present in the semiconductor layer of a large area by way of the laser beam scanning process.

There is also another problem for the method according to Literature 1. That is, as is apparent from FIGS. 10(a) and 10(b), the pinhole 6 is left as is, in any case. Such pinhole must to be filled in practice. Particularly, in the case of a semiconductor device in which a pinhole is left without being filled, water, alkali metal, or the like are apt to enter therethrough upon use. Once water or/and alkali metal, etc. enter thereinto, the semiconductor device will be quickly deteriorated. However, in order to fill up such pinhole, not only a specific technique is required but it also takes time, and because of this, the resulting product becomes unavoidably costly.

Likewise, there are problems also for the method according to Literature 2. That is, in the case of the method according to Literature 2, as is apparent from FIGS. 10(c) through 10(e), the pinhole 5 is filled by fusing the peripheries thereof, but this process is performed prior to forming the back electrode layer 4, and because of this, a pinhole which is formed at the time of forming the back electrode layer on the semiconductor layer 3 having the filled portion is unavoidably left without being filled. In addition to this, since the filling of the pinhole 5 is performed through the laser beam-irradiating process which takes time while exposing the semiconductor layer 3 to environmental atmosphere, the quality of the semiconductor 3 is apt to deteriorate during the filling process. Further in addition, powdery materials are formed when the semiconductor layer 3 is liquefied or vaporized because of heat from the laser beam irradiated thereto, wherein such powdery materials are scattered and deposited on the surface of the semiconductor layer and as a result, the device becomes defective in its characteristics.

As for the method according to Literature 2, there are disadvantages in that it takes a long period of time in order to detect a number of pinholes present at the semiconductor layer of a large area by way of the laser beam process; and it is extremely difficult to fill all such numerous pinholes uniformly by way of the laser beam fusing process.

In view of the above, in the case of the method according to Literature 2, if a desirable semiconductor device should be obtained, it will be unavoidably costly.

SUMMARY OF THE INVENTION

The principal object of the present invention is to eliminate the foregoing problems in the prior art and to provide an improved method which enables efficient, quick repair of a defective portion liable to cause a short circuit in a photoelectric conversion device, without performing a detecting process as in the prior art, thereby obtaining a defect-free photoelectric conversion device.

The term "defective portion" herein is meant to include a portion where a pinhole is present, a portion where a hillock extending from the conductive layer is present, and a portion where a pinhole having said hillock therein is present, these portions being liable to cause short circuits.

Another object of the present invention is to provide an improved process for efficiently producing a desirable photoelectric conversion device while repairing a defective portion of the semiconductor member thereof within a short period of time without performing a detecting process as in the prior art.

A further object of the present invention is to provide a process including the step of efficiently repairing a defective portion of the semiconductor member of a photoelectric conversion device within a short period of time which enables one to produce a desirable photoelectric conversion device, which is markedly improved with respect to short circuit current and opencircuit voltage and stably provides a desirable photoelectric conversion efficiency without being deteriorated even upon repeated use over a long period of time, at an improved yield.

The present invention effectively attains the above objects. The process according to the present invention is characterized as including the step of transforming a defective photoelectric conversion device into a defect-free photoelectric conversion device.

The present invention includes two aspects which will be described below.

One aspect of the present invention is to provide a process for producing a photoelectric conversion device comprising a semiconductor photoelectric conversion layer disposed on a conductive surface of a substrate, a transparent electrode layer disposed on said semiconductor layer, and a collecting electrode disposed on said transparent electrode layer, said process comprising the steps of:

(a) forming said semiconductor layer on the conductive surface of said substrate, (b) immersing the resultant composite obtained in step (a) in an electrolyte and subjecting said composite to electrolytic treatment wherein the conductive surface of the substrate is made to be an electrode, thereby selectively forming an insulating material at the portions where parts of the conductive surface of the substrate are exposed through said semiconductor layer so as to cover the exposed part, (c) forming said transparent electrode layer on the semiconductor layer, and (d) forming said collecting electrode on the transparent electrode layer.

Another aspect of the present invention is to provide a process for producing a photoelectric conversion device comprising a semiconductor photoelectric conversion layer disposed on a conductive surface of a substrate, a transparent electrode layer disposed on said semiconductor layer, and a collecting electrode disposed on said transparent electrode layer, said process comprising the steps of:

(a) forming said semiconductor layer on the conductive surface of said substrate, (b) forming said transparent electrode layer on the semiconductor layer, (c) immersing the resultant composite obtained in step (b) in an etching liquid to subject said composite to electrolytic treatment wherein the conductive surface of the substrate is made to be an electrode, thereby selectively removing part of the transparent electrode layer in communication with the conductive surface of the substrate through the semiconductor layer, (d) immersing the resultant obtained in step (c) in an electrolyte to subject said resultant to electrolytic treatment wherein the conductive surface of the substrate is made an electrode, thereby selectively forming an insulating coating at the portions where parts of the conductive surface of the substrate are exposed through said semiconductor layer so as to cover the exposed parts, and (e) forming said collecting electrode on the transparent electrode layer.

The present invention has been accomplished based on the following findings obtained as a result of experimental studies by the present inventor in order to attain the foregoing objects.

That is, the present inventor employed cathodic electrolytic etching treatment in order to repair a defective solar cell having one or more defective portions.

Particularly, there were provided a plurality of solar cells of the configuration shown in FIG. 7.

In FIG. 7, reference numeral 14 indicates a solar cell comprising a conductive substrate 10, an amorphous silicon semiconductor layer 1 formed on said conductive substrate, a transparent electrode layer 12 comprising ITO ($In_2O_3 + SnO_2$) formed on said semiconductor layer, and a collecting electrode 13 formed on said transparent electrode layer, wherein no defective portion is shown.

Each of the solar cells thus provided was immersed in an aqueous solution of hydrochloric acid as an etching liquid contained in a cathodic electrolytic etching treatment vessel as shown in FIG. 8.

In FIG. 8, reference numeral 27 indicates said electrolytic etching treatment vessel and reference numeral 25 indicates said aqueous solution of hydrochloric acid. Likewise, reference numeral 24 indicates an anode and reference numeral 26 indicates a power source electrically connected to the anode 24. The power source 26 is also electrically connected to the conductive substrate 0 of the solar cell 14 immersed in the aqueous solution of hydrochloric acid 25, wherein the conductive substrate 10 serves as a cathode. Reference numeral indicates 23 indicates a protective member disposed on the rear face of the conductive substrate 0 of the solar cell 4.

The power source 26 was switched on to apply electric power between the anode 24 and the cathode (that is, the conductive substrate 10). In the case where the solar cell 14 was defective, i.e. has one or more defective portions, current-flow was selectively caused at each of such defective portions through the conductive substrate 10 and the transparent electrode layer 12 comprising ITO, wherein etching occurred only at the portions of the transparent electrode layer 2 where the short-circuited portions were present. The etching herein was considered to have occurred due to the following chemical reactions.

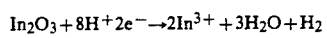

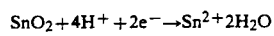

In this case, such etching did not occur at other portions of the transparent electrode layer where defective portions were not present since current-flow was not caused.

The defective solar cell could be repaired in this way.

The above procedures were repeated to thereby repair a plurality of defective solar cells having one or more defective portions.

Each of the solar cells thus repaired was evaluated with respect to the photovoltaic characteristics including photoelectric conversion efficiency and durability.

As a result, it was found that a solar cell repaired by the above cathodic electrolytic etching treatment is superior to a solar cell repaired by the laser processing of the prior art, with respect to the photovoltaic characteristics.

However, it was found that the photovoltaic characteristics of solar cells repaired by the above electrolytic reduction etching treatment are variable.

The present inventor experimentally investigated the reason for this. As a result, it was determined that there are various causes for the defective portions occurring in a solar cell and a certain type of defective portion cannot be repaired by the above cathodic electrolytic etching treatment. This situation will be explained with reference to FIG. 9.

FIG. 9 is a schematic cross section view illustrating an example of the solar cell repaired by the above cathodic electrolytic etching treatment in which such defective portion remains unrepaired. Particularly, in the solar cell shown in FIG. 9, reference numeral 16 indicates a defective portion (pinhole) repaired by the cathodic electrolytic etching treatment and reference numeral 15 indicates a defective portion (pinhole) which was not repaired by the cathodic electrolytic etching treatment. As is apparent from FIG. 9, the defective portion situated below the collecting electrode 13 is not repaired by the cathodic electrolytic etching treatment, whereas the defective portion situated where the collecting electrode 3 is not positioned is repaired.

In addition to this, the present inventor also found that leakage of current at the defective portion situated under the collecting electrode is greater than that at the other defective portion situated where the collecting electrode is not positioned.

The present inventor then repeated experimental studies in order to find an appropriate means which enables effective repair of all of the defective portions of a solar cell regardless of where their positions are situated. As a result, it was found that when an electro-deposition process, an electrolytic polymerization process or an electrolytic process is employed in order to repair a defective solar cell having one or more defective portions, an insulating material is selectively deposited only at those defective portions, whereby the defective solar cell is repaired to be a practically usable solar cell.

The term electro-deposition process means a process of depositing an insulating material on an object by applying a voltage between opposite polarity electrodes in an aqueous solution of paint or a dispersion of a resin.

The paint or the resin may be those capable of being negatively or positively charged. Specific examples are paints and resins having carboxyl groups which can be negatively charged, and paints and resins having amino groups which can be positively charged.

In order to repair a defective solar cell having one or more defective portions by the electro-deposition process, the defective solar cell, which serves as an anode or cathode, is immersed in the foregoing aqueous solution or dispersion, in which a counter electrode is also immersed. A voltage, desirably of 5 to 50 V, is then applied between the solar cell and the counter electrode to cause an electric field, desirably sufficient to provide 1 to 100 mA/cm$^2$ in current density, by which the paint or the resin is negatively or positively charged, and the charged paint or resin moves to cause selective deposition of an insulating material only at each of the defective portions of the solar cell so as to cover each of the defective portions such that no short circuits are caused.

The term electrolytic polymerization process means a process of depositing a polymer film on an object by applying a DC voltage (hereinafter referred to as direct current voltage) between the object as an anode and a counter electrode as a cathode in an electrolytic liquid comprising a solution or a dispersion of a monomer, to thereby polymerize the monomer.

In order to repair a defective solar cell having one or more defective portions by the electrolytic polymerization process, the defective solar cell, which serves as the anode, is immersed in an electrolytic liquid comprising a solution or a dispersion of a given monomer, in which a counter electrode as the cathode is also immersed. A direct current voltage, desirably of 0.5 to 20 V is applied between the defective solar cell and the counter electrode, desirably sufficient to provide 0.1 to 100 mA/cm$^2$ in current density, wherein the monomer in the electrolytic solution in the vicinity of each of the portions of the solar cell is polymerized due to current flow caused through the defective portion, whereby deposition of a polymer film is selectively caused only at each of the defective portions so as to cover each of the defective portions such that no short circuits are caused.

Specifically, the electrolytic liquid comprises an electrolyte and a monomer dissolved in a solvent. Specific examples of the electrolyte are acids such as $H_2SO_4$, HCl, $HNO_3$, etc., and salts comprising monovalent metal ions such as $Li^+$, $K^+$, $Na^+$, $Rb^+$, $Ag^+$, etc. or tetraammonium ions such as $TBS^+$ (tetrabutylammonium ion), $TEA^+$ (tetraethylammonium ion), etc. and Lewis acid ions such as $BF_4P^-$, $PF_6^-$, $AsF_6^-$, $ClO_4^-$, etc. The electrolytic liquid may contain $CuCl_2$, or $FeCl_3$, other than the preceding electrolytes. Specific examples of the solvent are water, alcohols, acetonitrile ($CH_3CN$), benzonitrile ($C_6H_5CN$), propylene carbonate (PC), dimethylformamide (DMF), tetrahydrofuran (THF), nitrobenzene ($C_6H_5NO_2$), etc. Specific examples of the monomer are compounds having conjugated double bond, such as pyrrole, aniline, thiophene, benzene, furan, phenol, dimethoxyphenol, phenylsilanol, thiophenol, vinylcarbazole, pyridazine, selenophene, etc. Among these compounds, cyclic compounds are preferred and cyclic compounds containing an oxygen atom (O) or a silicon atom (Si) are the most preferred. Use of an organic solvent is desired in order for the resulting polymer film to excel in adhesion, be dense in texture, and free of pinholes. In order to improve the insulating property of the resulting polymer film, it is desired that the anions contained in the polymer film formed as a result of the electrolytic polymerization of the monomer be released therefrom by applying a voltage of a reverse polarity between the solar cell (as a cathode in this case) and a counter electrode (anode).

The term electrolytic process means a process of depositing an oxide film on an object by applying a direct current voltage between opposite electrodes in an electrolytic solution containing an inorganic compound.

In order to repair a defective solar cell having one or more defective portions by the electrolytic process, the defective solar cell, which serves as an anode, is immersed in an electrolytic solution containing an inorganic compound, in which a counter electrode (cathode) is immersed. A direct current voltage, desirably of 0.5 to 50 V is then applied between the solar cell as the anode and the cathode, desirably sufficient to provide 1 to 1000 mA/cm$^2$ in current density, whereby deposition of an oxide film is selectively caused only at each of the defective portions so as to cover each of the defective portions such that no short circuits are caused.

As the electrolytic solution, there can be used an aqueous solution of sulfuric acid, oxalic acid, phosphoric acid, boric acid, or chromic acid. Specific examples of the inorganic compound are $MnSO_4$, $H_2SiF_6$, etc.

The electrolytic solution used in any of the electro-deposition process, the electrolytic polymerization process and the electrolytic process is desired to additionally contain an insulator in the form of fine particles (hereinafter referred to as fine particle insulator) and one or more additives selected from surfactants, metal alkoxide, acetylacetone metal complex, metal octylate, metal naphthenate, phosphazene, etc.

Specific examples of the fine particle insulator are alumina, silica, titanium oxide, tantalum oxide, zirconium oxide, glass, silicon carbide, silicon nitride, barium sulfate, fluorinated graphite, ethylene fluoride, polyvinyl chloride, epoxy resin, etc. The fine particle insulator is desired to be of 0.01 to 10 microns in mean particle size. In the case of using such fine particle insulator in combination with an ionic surfactant in the electro-deposition process, the efficiency of electro-deposition is improved.

As the metal alkoxide, there can be illustrated ethoxy or butoxy alkoxides of silicon, aluminum, titanium, tantalum, germanium, zirconium, etc. Specific examples are tetraethoxy silicon, tripropoxy silicon, tetrabutoxy silicon, triethoxy aluminum, tripropoxy aluminum, and tributoxy aluminum, etc.

Specific examples of the acetylacetone metal complex are acetylacetone aluminum complex, acetylacetone titanium complex, acetylacetone manganese complex, and acetylacetone barium complex.

Specific examples of the metal octylate are aluminum octylate, zirconium octylate, manganese octylate, and barium octylate.

Specific examples of the metal naphthenate are zirconium naphthenate and manganese naphthenate.

The process according to the present invention makes it possible to efficiently produce a desirable defect-free photoelectric conversion device of a large area with an improved yield even in the case of using a conductive member accompanied by a plurality of minute protrusions such as stainless steel, which is apt to cause defective portions, which lead to occurrence of short circuits, at the photoelectric conversion layer formed thereon. Particularly, those defective portions caused at the photoelectric conversion layer are repaired by an insulating material selectively deposited at each of those defective portions and because of this, the resulting photoelectric conversion device is free of defective portions, which are liable to cause short circuits, outputs a satisfactory electric current, and is hardly deteriorated even upon repeated use over a long period of time.

BRIEF DESCRIPTION OF THE DRAWINGS

FIG. is a schematic cross section view illustrating the constitution of an example of a repaired photoelectric conversion device in the present invention.

DETAILED DESCRIPTION OF THE PREFERRED EMBODIMENTS

The process for producing a defect-free photoelectric conversion device is characterized as including the step of repairing a defective portion liable to cause a short circuit, comprising a pinhole, hillock, pinhole having a hillock therein, or the like, formed at the constituent elements of a photoelectric conversion device during the formation thereof by virtue of a method of selectively forming an insulating material at said defect by utilizing an electro-deposition process, an electrolytic polymerization process, or an electrolytic process.

The process according to the present invention makes it possible to efficiently produce a defect-free large area photoelectric conversion device at an improved yield. The process according to the present invention is applicable not only in the production of a solar cell but also in the production of other photoelectric conversion devices such as a photosensor, a electrophotographic photosensitive member, etc.

The process according to the present invention is particularly effective in the production of a solar cell.

In the following, explanation will be made of the process according to the present invention in the case of producing a defect-free solar cell.

Figure 1:
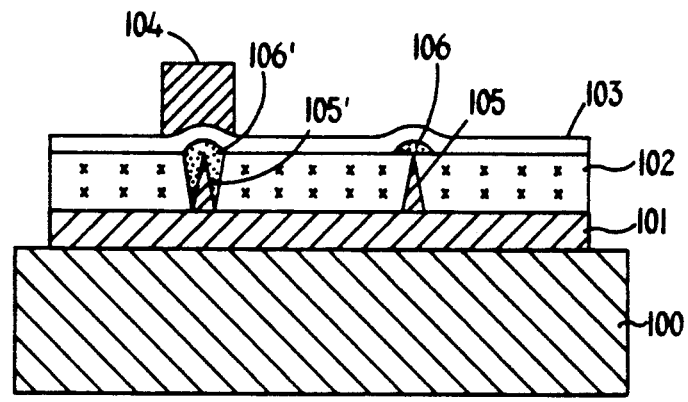

Shown in FIG. 1 is a schematic cross section view of the constitution of a first example of a repaired solar cell produced by the process according to the present invention. Shown in FIG. 2 is a schematic cross section view of the constitution of a second example of a repaired solar cell produced by the process according to the present invention.

In FIG. 1, reference numeral 100 indicates a conductive substrate. Reference numeral 10 indicates a conductive layer as a lower electrode disposed on the conductive substrate 100. Reference numeral 102 indicates a semiconductor later disposed on the lower electrode (conductive layer) 101. Reference numeral 103 indicates a transparent conductive layer as an upper electrode disposed on the semiconductor layer 102. Reference numeral 104 indicates a collecting electrode disposed on the upper electrode (transparent conductive layer) 103. Reference numeral 105 indicates a defective portion comprising a hillock extending from the conductive layer formed in the semiconductor layer 102 above which the collecting electrode 104 is not positioned. Reference numeral 105' indicates another defective portion comprising a pinhole containing a hillock extending from the conductive layer 101 formed in the semiconductor layer 102 situated under the collecting electrode 104. Reference numeral 106 indicates an insulating film formed to cover the defective portion 105 such that no short circuit is caused. Reference numeral 106' indicates an insulating film formed to fill the defective portion 105' such that no short circuit is caused.

Figure 2:
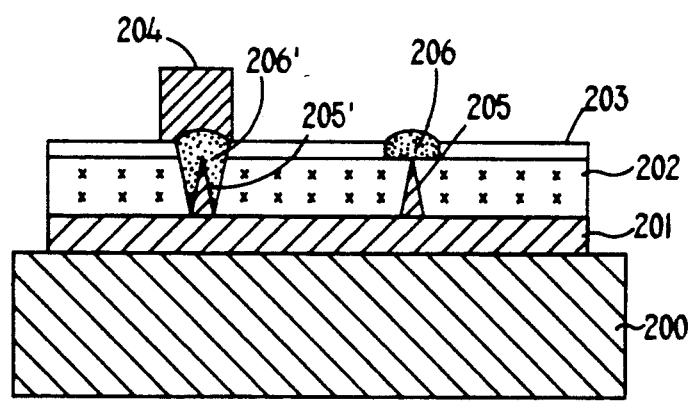
FIG. 2 is a schematic cross section view illustrating the constitution of another example of a repaired photoelectric conversion device in the present invention.

In FIG. 2, reference indicates 200 indicates a conductive substrate. Reference numeral 201 indicates a conductive layer as a lower electrode disposed on the conductive substrate 200. Reference numeral 202 indicates a semiconductor layer disposed on the lower electrode (conductive layer) 201. Reference numeral 203 indicates a transparent conductive layer as an upper electrode disposed on the semiconductor layer 202. Reference numeral 204 indicates a collecting electrode disposed on the upper electrode (transparent conductive layer) 203. Reference numeral 205 numeral indicates a defective portion comprising a hillock extending from the conductive layer 20 formed in the semiconductor layer 202 above which the collecting electrode 204 is not positioned. Reference numeral 205' indicates another defective portion comprising a pinhole containing a hillock extending from the conductive layer 20 formed in the semiconductor layer 202 situated under the collecting electrode 204. Reference numeral 206 indicates an insulating film formed to cover the defective portion 205 while penetrating the upper electrode 203 such that no short circuit is caused. Reference numeral 206' indicates an insulating film formed to fill the defective portion 205' while penetrating the upper electrode 203 such that no short circuit is caused.

In the case of the repaired solar cell shown in FIG. 1, the defective portions 105 and 105' are covered or filled by the insulating material 106 or 106, selectively deposited at the corresponding defective portion by virtue of the foregoing method of selectively forming an insulating material utilizing an electro-deposition process, an electrolytic polymerization process, or an electrolytic process such that no current leakage occurs between the lower electrode 101 and the upper electrode 103.

Likewise, in the case of the repaired solar cell shown in FIG. 2, the defective portions 205 and 205' are covered or filled by the insulating material 206 or 206' selectively deposited at the corresponding defective portion by virtue of the foregoing method of selectively forming an insulating material utilizing an electro-deposition process, an electrolytic polymerization process, or an electrolytic process such that no current leakage occurs between the lower electrode 20 and the upper electrode 203.

The conductive substrate (100 or 200) is comprised of a metal member such as stainless steel, aluminum, copper, titanium, carbon sheet, galvanized sheet metal, etc.

The conductive layer as the lower electrode (101 or 201) is comprised of a metallic material such as Ti, Cr, Mo, W, Al, Ag, Ni, etc. As an alternative, the conductive substrate (100 or 200) may be designed such that it serves also as the lower electrode (101 or 201).

It is possible to dispose a diffusion preventive layer comprising an inorganic oxide such as ZnO, TiO$_2$, SnO$_2$, etc. on the conductive layer as the lower electrode (101 or 201) where necessary.

The conductive layer as the lower electrode may be formed by a resistance heating evaporation method, an electron beam evaporation method, a sputtering method, or a MO-CVD method.

The semiconductor layer (102 or 202) is comprised of a non-single crystal material such as polycrystalline material, microcrystalline material, or amorphous material. The semiconductor layer may be a pn junction layer, a pin junction layer, or a hetero junction layer respectively comprising a plurality of semiconductor films of different conduction type or band gap which are stacked one over the other.

Specifically, the semiconductor layer is composed of a non-single crystal silicon-containing material such as non-single crystal silicon, non-single crystal silicon carbide, non-single crystal silicon germanium, and the like which may be formed by a plasma CVD method, a photo CVD method, a thermal CVD method, a vacuum evaporation method, or a sputtering method. In the case where the semiconductor layer is desired to be composed of an amorphous silicon material or a microcrystalline silicon material, the plasma CVD method is the most appropriate when the formation thereof.

Other than the above film-forming methods, it is possible to employ a so-called casting method wherein fused silicon is firstly provided and the fused silicon is spread out in a sheet-like state while cooling, whereby a desired semiconductor layer is formed. This casting method is appropriate when the semiconductor layer is to be of a large area.

The semiconductor layer (102 or 202) may be comprised of a compound semiconductor material such as CdS, CdTe, CuInSe$_2$, ZnSe, ZnSeTe or the like which may be formed by an electron beam evaporation method, a sputtering method or an electro-deposition method.

The transparent conductive layer as the upper electrode (103 or 203) is comprised of an inorganic oxide material such as In$_2$O$_3$, SnO$_2$, ITO (In$_2$O$_3$+SnO$_2$), ZnO, TiO$_2$, Cd$_2$SnO$_4$, etc. or a crystalline semiconductor film doped with an impurity at a high concentration.

The transparent conductive layer as the upper electrode may be formed by a heat resistance evaporation method, an electron beam evaporation method, a sputtering method, a spray coating method, a chemical vapor deposition method, or an impurity diffusion method.

The collecting electrode (104 or 204) is comprised of a metallic material such as Ti, Cr, Mo, W, Al, Ag, Ni, Cu, or Sn. Alternatively, the collecting electrode may be formed using a conductive paste such as Ag-paste or Ni-paste.

The collecting electrode comprising such metallic material may be formed by an appropriate method such as a sputtering method wherein a mask pattern is used; a heat resistance evaporation method; a chemical vapor deposition method, a method wherein a metal is firstly deposited on the entire area, followed by subjecting the result to patterning by means of etching; a method wherein a patterned collecting electrode is formed by means of a photo CVD technique; or a method wherein a negative mask for the pattern of the collecting electrode is firstly formed, followed by subjecting the result to plating processing. The collecting electrode comprising the foregoing conductive paste may be formed by applying such conductive paste, for example, by means of a screen printing technique.

Explanation will be made of a first embodiment of the process of producing a repaired photoelectric conversion device of the configuration similar to that shown in FIG. 1 according to the present invention, with reference to FIGS. 3(a) through 3(c) and FIG. 4.

Figure 3A:
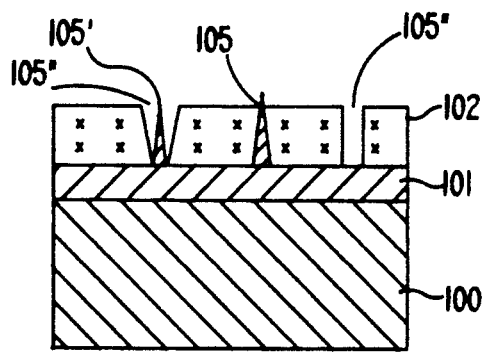
FIGS. 3(a) through 3(c) are schematic explanatory views illustrating the steps of obtaining the repaired photoelectric conversion device shown in FIG. 1.
Figure 3B:
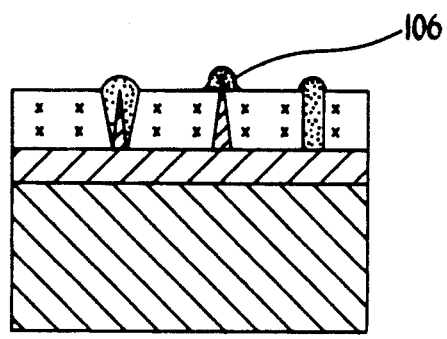
Figure 3C:
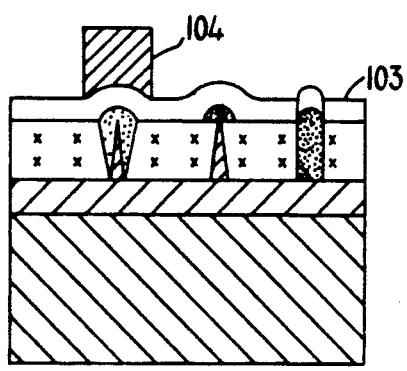

FIG. 3(a) is a schematic cross section view illustrating a defective photoelectric conversion element having neither a transparent conductive layer as the upper electrode nor a collecting electrode in which defective portions are present; FIG. 3(b) is a schematic cross section view illustrating a photoelectric conversion element in which the defective portions shown in FIG. 3(a) are repaired by the electrolytic treatment according to the present invention; and FIG. 3(c) is a schematic cross section view illustrating the configuration of a finished photoelectric conversion device.

Figure 4:
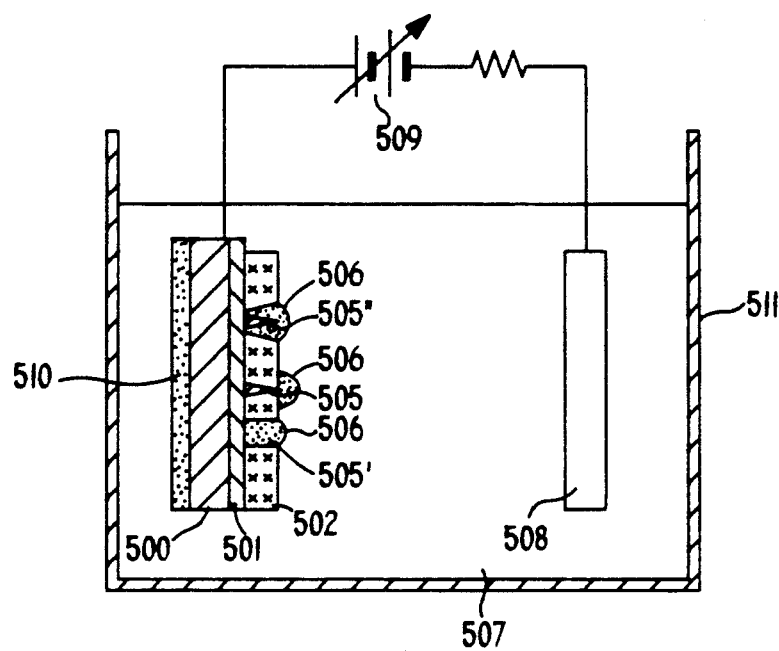
FIG. 4 is a schematic diagram of an example of an electrolytic treatment apparatus employed in the present invention.

FIG. 4 is a schematic diagram of an example of an apparatus suitable for practicing the electrolytic treatment according to the present invention.

Now, there is firstly provided a conductive substrate 100 comprising the foregoing metal member. On the conductive substrate 100 are successively formed a conductive layer to be the lower electrode 101 comprising the foregoing metallic material and a semiconductor layer 102 comprising the foregoing semiconductor material.

Thus, there is obtained a photoelectric conversion element comprising the conductive layer as the lower electrode 101 and the semiconductor layer 102 being disposed in this order on the conductive substrate 100.

However, during the formation of this element, there are often occurred defective portions: a pinhole 105" due to deposition or release of foreign matter such as dust, etc., a hillock 105 grown from the conductive layer as the lower electrode due to heat, and another pinhole 105" having a hillock 105' extending from the conductive layer as the lower electrode, as shown in FIG. 3(a).

These defective portions present in the defective photoelectric conversion element are repaired by subjecting the defective photoelectric conversion element to the electrolytic treatment according to the present invention using the apparatus shown in FIG. 4 to deposit an insulating material 06 selectively at each of the defective portions, whereby the pinhole 105" is filled up with the insulating material, the hillock 105 is covered by the insulating film, and the pinhole 105" containing the hillock 105' is filled up with the insulating material as shown in FIG. 3(b), respectively, such that no short circuit is caused.

Then, on the surface of the semiconductor layer 102 of the repaired photoelectric conversion element there are successively formed a transparent conductive layer as the upper electrode 103 comprising the foregoing inorganic oxide material or the foregoing impurity-doped crystalline semiconductor film and a collecting electrode 104 comprising the foregoing metallic material as shown in FIG. 3(c). As a result, there is obtained a finished photoelectric conversion device in which the defective portion situated under the collecting electrode is sufficiently repaired in a desirable state and which is free of short circuits.

Explanation will be made of the above step of repairing the defective photoelectric conversion element by subjecting it to the electrolytic treatment according to the present invention using the apparatus shown in FIG. 4.

As above described, FIG. 4 is a schematic diagram of an example of an apparatus suitable for practicing the electrolytic treatment according to the present invention.

Any of the foregoing electro-deposition process, the foregoing electrolytic polymerization process, and the foregoing electrolytic process can be selectively employed for practicing the electrolytic treatment. And any of these processes can be practiced in the apparatus shown in FIG. 4. In FIG. 4, reference numeral 511 indicates an electrolysis vessel in which an electrolytic solution 507 is contained. Reference numeral 508 indicates a counter electrode immersed in the electrolytic solution 507. The counter electrode 508 is electrically connected to a D.C. power source 509. The D.C. power source is electrically connected to a defective photoelectric conversion element to be repaired which is immersed in the electrolytic solution 507. The photoelectric conversion element shown in FIG. 4 is in a repaired state corresponding to the repaired photoelectric conversion element shown in FIG. 3(b).

The photoelectric conversion element comprises a conductive layer 501 as the lower electrode and a semiconductor layer 502 being disposed in this order on a conductive substrate 500. Reference numeral 510 indicates a protective member, which is disposed such that it covers not only the entire rear surface but also the opposite side faces of the conductive substrate 500. The protective member 510 serves not only to prevent the conductive substrate 500 from contacting the electrolytic solution 507 but also to prevent the electrolytic reaction from being reduced in terms of efficiency.

The conductive substrate 500 or the lower electrode 501 serves as an electrode to oppose the counter electrode 508. Reference numeral 505 indicates a defective portion comprising a hillock extending from the conductive layer as the lower electrode 501, reference numeral 505' indicates another defective portion comprising a pinhole, and reference numeral 505" indicates a further defective portion comprising a pinhole containing a hillock extending from the conductive layer as the lower electrode 501.

The counter electrode 508 is made of a corrosion resistant material such as platinum, carbon, nickel, or stainless steel. The protective member 510 is comprised of an insulating film of acetylcellulose or magnetic rubber.

Under this situation, the foregoing electro-deposition process, the foregoing electrolytic polymerization process or the foregoing electrolytic process is performed to deposit an insulating material 506 selectively at each of the defective portions, whereby the pinhole 505' is filled with the insulating material, the hillock 505 is covered by the insulating film, and the pinhole 105" containing the hillock is filled with the insulating material respectively as shown in FIG. 4, each such that no short circuit is caused.

Explanation will now be made of a second embodiment of the process of producing a repaired photoelectric conversion device of the configuration similar to that shown in FIG. 2 according to the present invention, with reference to FIGS. 5(a) through 5(c) and FIG. 6.

Figure 5A:
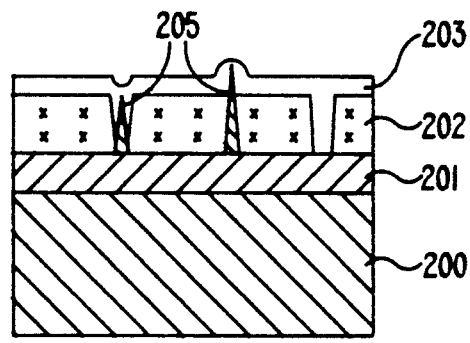
FIGS. 5(a) through 5(c) are schematic explanatory views illustrating the steps of obtaining the repaired photoelectric conversion device shown in FIG. 2.
Figure 5B:
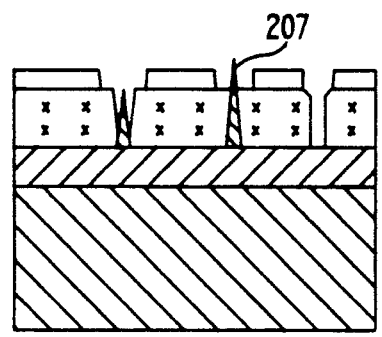
Figure 5C:
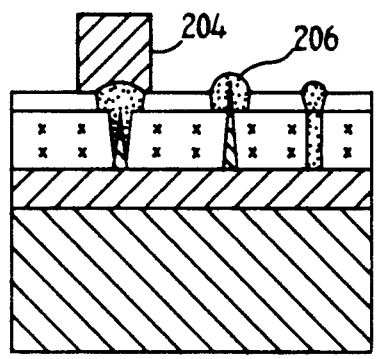

FIG. 5(a) is a schematic cross section view illustrating the situation of a photoelectric conversion element not having a collecting electrode, and in which defective portions are present; FIG. 5(b) is a schematic cross section view illustrating the situation of a photoelectric conversion element in which the defective portions shown in FIG. 5(a) are repaired by the electrolytic treatment according to the present invention; and FIG. 5(c) is a schematic cross section view illustrating the configuration of a finished photoelectric conversion device.

In FIG. 5(a) there is firstly provided a conductive substrate 200 comprising the foregoing metal member. On the conductive substrate 200 are successively formed a conductive layer as the lower electrode 201 comprising the foregoing metallic material, a semiconductor layer 202 comprising the foregoing semiconductor material, and a transparent conductive layer as the upper electrode 203 comprising the foregoing inorganic oxide material or the foregoing crystalline semiconductor film.

Thus, there is obtained a photoelectric conversion element comprising the conductive layer as the lower electrode 201, the semiconductor layer 202, and the transparent conductive layer as the upper electrode 203 disposed in this order on the conductive substrate 200.

However, during the formation of this element, there often occur defective portions: a pinhole due to deposition or release of foreign matter such dust particles, etc., a hillock 205 grown from the conductive layer lower electrode due to heat, and another pinhole having a hillock 205 extending from the conductive layer as the lower electrode, a shown in FIG. 5(a).

Figure 6:
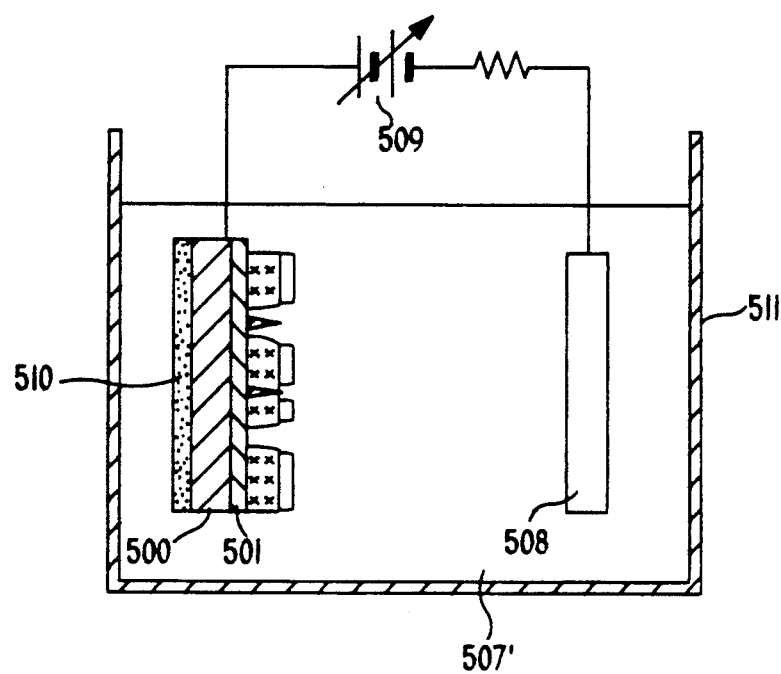
FIG. 6 is a schematic diagram of an example of a cathodic electrolytic etching apparatus employed in the present invention.
Figure 7:
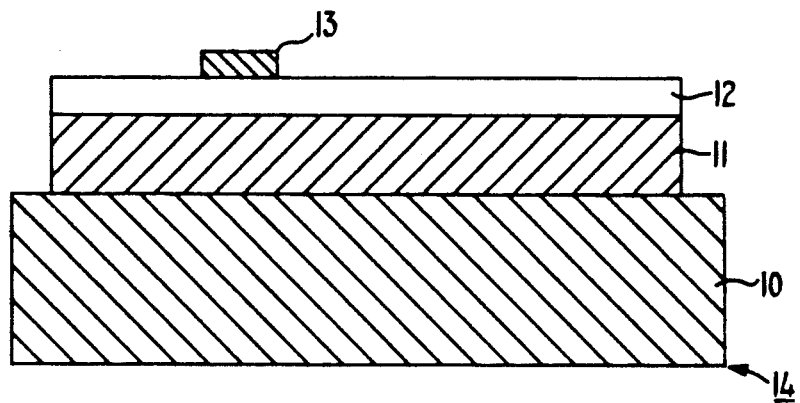
FIGS. 7, 8, and 9 are schematic views for explaining the method of repairing a defective photoelectric conversion device by means of a selective etching technique.
Figure 8:
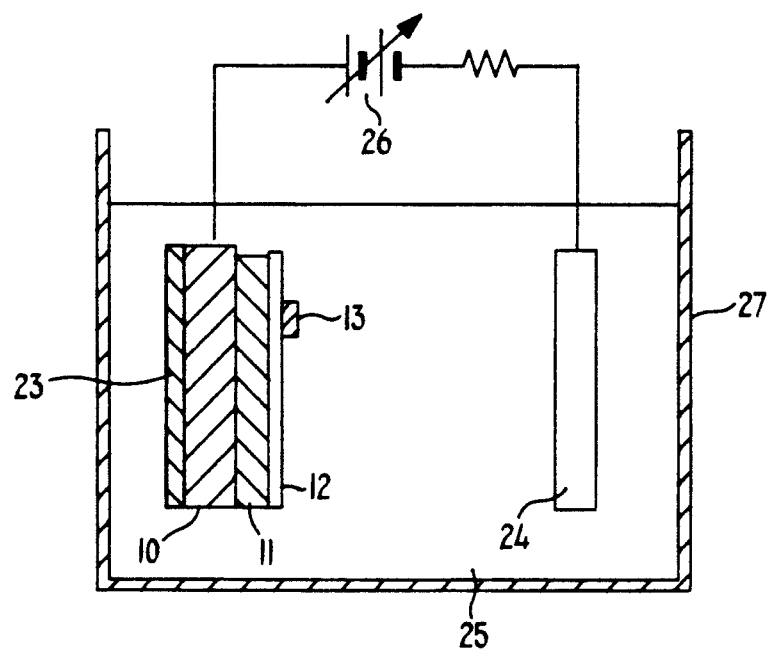
Figure 9:
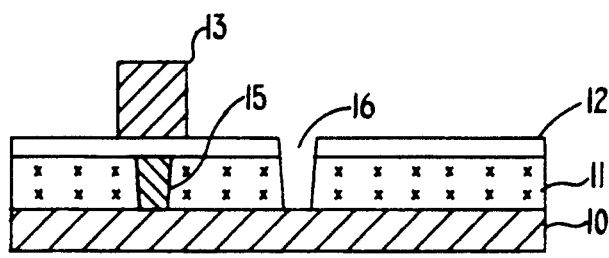
Figure 10A:
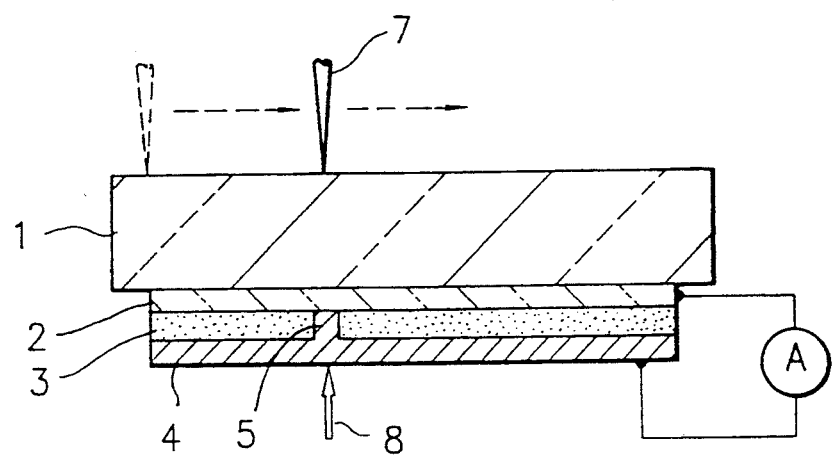
FIGS. 10(a), 10(b), 10(c), 10(d), and 10(e) are schematic views respectively for explaining a conventional method of repairing a defective semiconductor device.
Figure 10B:
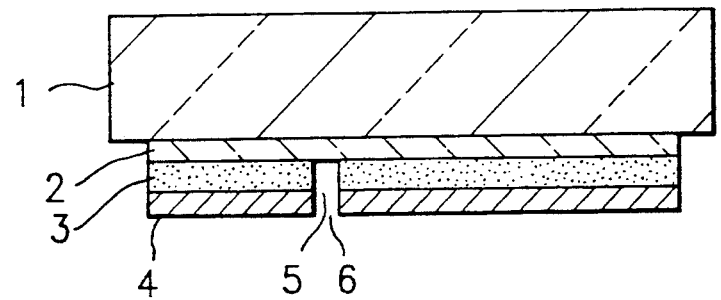
Figure 10C:
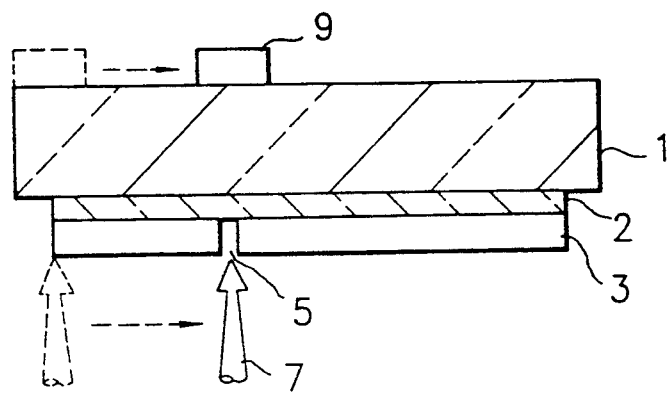
Figure 10D:
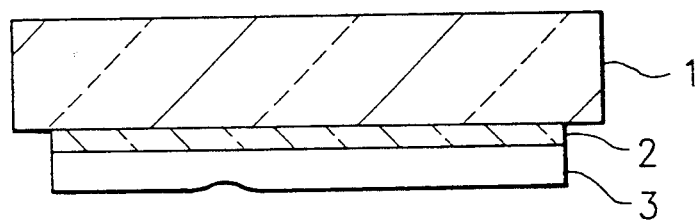
Figure 10E:
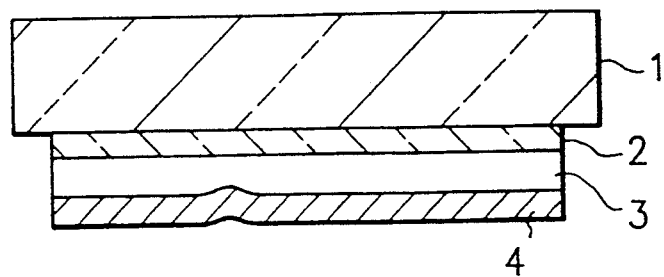

In this embodiment, prior to subjecting the defective photoelectric conversion element to the electrolytic repairing treatment, the corresponding portions of the transparent conductive layer 203 under which the defective portions are present are removed by subjecting the defective photoelectric conversion element to an electrolytic etching treatment using the electrolytic etching apparatus shown in FIG. 6. The electrolytic etching apparatus shown in FIG. 6 is of the same constitution as that of the apparatus shown in FIG. 4, except that the electrolytic solution 507 in FIG. 4 is replaced by an electrolytic etching solution 507'.

As the electrolytic etching solution 507', there is used, for example, an electrolytic solution containing hydrogen ion and/or hydronium ion.

The conductive substrate 500 or the conductive layer as the lower electrode 501 of the defective photoelectric element immersed in the electrolytic etching solution 507' is made a cathode, and the counter electrode 508 is made an anode.

Then, the D.C. power source 509 is switched on to apply a predetermined voltage with a predetermined current density between the two electrodes, wherein the corresponding portions of the transparent conductive layer 203 under which the defective portions are present are selectively reduced and dissolved into the electrolytic etching solution 507'. As a result, there is afforded a defective photoelectric conversion element in which defective portions are exposed through the transparent conductive upper electrode layer as shown in FIG. 5(b).

The defective photoelectric conversion element thus obtained is then subjected to the same electrolytic repair treatment as in the above embodiment using the apparatus shown in FIG. 4 to deposit an insulating material 206 selectively at each of the defective portions, whereby the pinhole is filled with the insulating material, the hillock is covered by the insulating film, and the pinhole containing the hillock is filled with the insulating material, respectively, as shown in FIG. 5(c), such that no short circuit remains.

Then, on the surface of the transparent conductive upper electrode layer of the repaired photoelectric conversion element, there is formed a collecting electrode 204 comprising the foregoing metallic material as shown in FIG. 5(c). As a result, there is obtained a finished photoelectric conversion device in which the defective portion situation under the collecting electrode is sufficiently repaired in a desirable state and which is free of occurrence of short circuits.

Of the above two embodiments of the process according to the present invention, the first embodiment is simpler than the second embodiment in view of the number of the steps performed. However, the second embodiment is more advantageous than the first embodiment since in the case of the second embodiment, a consistent dry process is continued up to the formation of the transparent conductive upper electrode layer and because of this, there is no occasion for the semiconductor layer to absorb water, whereby the characteristics of the semiconductor layer are stably maintained. Although the electrolytic etching step is additionally performed in the second embodiment, that step is simpler in comparison with a conventional repairing method and therefore, the influence of this step on the production cost is slight.

The present invention will be described more specifically while referring to the following examples, but the scope of the present invention is not intended to be limited to these examples.

EXAMPLE 1

In this example, there was prepared a defect-free amorphous silicon solar cell of the configuration shown in FIG. 2.

Firstly, there was provided a stainless steel plate as the conductive substrate 200. This stainless steel plate was well cleaned in a cleaning vessel.

On the cleaned stainless steel plate there was formed a conductive layer as the lower electrode 201 comprising a 500 Å thick Al film contained 1% by weight of Si and a 1.5 um thick ZnO film laminated in this order from the side of the conductive substrate 200 by a sputtering method.

On the conductive layer 20 there was then formed a 4300 Å thick nip junction amorphous silicon semiconductor layer as the semiconductor layer 202, comprising a 200 Å thick n-type semiconductor film, a 4000 Å thick i-type semiconductor film, and a 100 Å thick p-type semiconductor film laminated in this order from the side of the conductive substrate 200 by a plasma CVD method using $SiH_4$, $PH_3$, $B_2H_6$, and $H_2$ gases.

Then, on the nip junction amorphous silicon semiconductor layer 202 thus formed there was formed an 800 Å thick ITO transparent conductive layer as the upper electrode 203 by a thermal resistance evaporation method.

The solar cell element thus obtained was immersed in the electrolytic etching solution 507' comprising an aqueous solution of $AlCl_3$ contained in the electrolytic vessel 51 shown in FIG. 6, in which a platinum electrode as the counter electrode was immersed. The conductive substrate 200 comprising the stainless steel plate of the solar cell element was made a cathode, whereas the platinum electrode was made an anode. Then, the D.C. power source 509 was switched on to apply a direct current voltage of 3 V between the two electrodes, wherein the corresponding portions of the transparent conductive layer as the upper electrode 203 under which defective portions are present were reduced to dissolve into the electrolytic etching solution 507'. A magnetic rubber member was disposed on the etched solar cell element such that it covered not only the rear surface but also the opposite side faces of the conductive substrate. The result was immersed in the electrolytic solution 507 comprising an electrolytic solution obtained by dissolving 0.1 mole/liter of furan into 0.5 mole/liter of a solution of tetrabutylammonium perchlorate contained in the electrolytic vessel 511 shown in FIG. 4, in which a platinum electrode as the counter electrode 508 was immersed. The conductive substrate 200 was made an anode, whereas the platinum electrode was made a cathode. The D.C. power source 509 was switched on to apply a direct current voltage of 5.0 V with a current density of 5 mA/cm$^2$ between the two electrodes, whereby a polymer film was deposited selectively at each of the defective portions. Then, the conductive substrate 200 was made a cathode, whereas the platinum counter electrode 508 was made an anode, wherein the D.C. power source was switched on to apply a direct current voltage of 2.0 V between the two electrodes to thereby release anions from the respective deposited polymer films. The solar cell element thus treated was taken out from the apparatus shown in FIG. 4, followed by drying. On the transparent conductive layer as the upper electrode 203 of the solar cell element there was formed a negative pattern mask comprising a photosensitive resin film for the formation of a collecting electrode. The result was immersed in a sulfuric acid-containing aqueous solution of copper sulfate, wherein the upper electrode 203 was made a cathode and a phosphorus-containing copper plate was made an anode, and the collecting electrode pattern was subjected to Ni/Cu plating to thereby form the collecting electrode 204. Thus, there was obtained a repaired solar cell.

Separately, there was prepared a comparative solar cell by repeating the above procedures, except for not performing the electrolytic polymerization process.

Each of the resultant solar cells was evaluated with respect to short circuit current output. As a result, it was found that the repaired solar cell surpasses the comparative solar cell by about 20%.

In addition, whether or not the solar cell obtained in this example is accompanied by defective portions was observed by a so-called Cu-decoration method.

The Cu-decoration method observes the presence of a defective portion in a semiconductor device such as a photoelectric conversion device, etc. by immersing the device in an aqueous solution of copper sulfate contained in an electrolytic vessel having a counter electrode therein and applying a predetermined voltage between the semiconductor device and the counter electrode in the aqueous solution of copper sulfate, wherein if one or more defective portions are present in the semiconductor device, copper is deposited selectively at each defective portion.

The solar cell obtained in this example was subjected to treatment by this Cu-decoration method.

The above comparative cell was also subjected to treatment by this Cu-decoration method.

For each of the two cells, the presence or absence of defective portions deposited with copper was observed using a microscope.

As a result, it was found that the number of defective portions of the solar cell obtained in this example is 1/10,000 that of the comparative solar cell.

EXAMPLE 2

In this example, there was prepared a defect-free solar cell of the configuration shown in FIG. 1.

Firstly, there was provided a stainless steel plate as the conductive substrate 100. This stainless steel plate was well cleaned in a cleaning vessel.

On the cleaned stainless steel plate there was formed a conductive layer as the lower electrode 101 comprising a 5000 Å thick Mo-film by a sputtering method. Then, there were successively formed by a sputtering method a 2000 Å thick Cu-film and a 4000 Å thick In-film on the Mo-film as the lower electrode 101, followed by exposing the result to H$_2$Se vapor, and subjecting it to heat treatment in a nitrogen gas atmosphere maintained at 400° C., thereby forming a CuInSe$_2$ layer on the lower electrode 101. Successively, there was formed a 6000 Å thick ZnCd film on the CuInSe$_2$ layer by a sputtering method. Thus, a multilayered semiconductor layer 102, comprising the CuInSe$_2$ layer and the ZnCd layer laminated in this order from the side of the conductive substrate 100, was formed on the lower electrode 101. An acetylcellulose film was disposed on the resultant solar cell element such that it covered not only the rear surface but also the opposite side faces thereof. The result was immersed in the electrolytic solution 507 comprising an aqueous solution containing a water soluble carboxylic paint dissolved therein contained in the electrolytic vessel 511 shown in FIG. 4, in which a platinum electrode as the counter electrode 508 was immersed. The conductive substrate 100 of the solar cell element was made an anode, whereas the platinum electrode was made a cathode. Then the D.C. power source 509 was switched on to apply a direct current voltage of 40 V between the two electrodes, whereby an insulating paint was deposited selectively at each of the defective portions of the solar cell element.

On the semiconductor layer 102 of the solar cell element thus repaired there was formed a 700 Å thick ZnO film as the transparent conductive layer 103 there by a sputtering method. Finally, on the transparent conductive layer 103 there was applied a Ag-paste by means of a screen printing technique to thereby form a collecting electrode 104.

Thus, there was obtained a repaired copper indium selenide solar cell.

Separately, there was prepared a comparative solar cell by repeating the above procedures, except for not performing the electrolytic process of depositing the insulating paint.

Each of the resultant solar cells was evaluated with respect to short circuit current output. As a result, it was found that the solar cell obtained in this example surpasses the comparative solar cell by about 18%.

In addition, whether or not each of the solar cell obtained in this example and the comparative solar cell is accompanied by defective portions was observed in the same manner as in Example 1.

As a result, it was found that the number of defective portions of the solar cell obtained in this example is 1/12,000 that of the comparative solar cell.

EXAMPLE 3

In this example, there was prepared a defect-free amorphous silicon solar cell of the configuration shown in FIG. 1.

Firstly, there was provided a titanium plate as the conductive substrate 100. This titanium plate was well cleaned in a cleaning vessel.

On the cleaned titanium plate there was formed by a sputtering method a conductive layer as the lower electrode 10 comprising a 5000 Å thick aluminum film. Then, on the conductive layer 10 there was formed an nip junction semiconductor layer 02 by a plasma CVD method.

A magnetic rubber member disposed on the resultant solar cell element such that it covered not only the rear surface but also the opposite side faces of the conductive substrate 100. The resultant was immersed in the electrolytic solution 507 comprising an aqueous solution of 0.5 mole/liter sulfuric acid, containing 0.3 mole/liter of MnSO$_4$ contained in the electrolytic vessel 51 shown in FIG. 4, in which a carbon electrode as the counter electrode 508 was immersed. The conductive substrate 100 of the solar cell element was made an anode, whereas the carbon electrode was made a cathode. Then, the D.C. power source 509 was switched on to supply a direct current voltage of 10 V with a current density of 5 mA/cm$^2$ between the two electrodes, whereby an insulating material of MnO$_2$ was deposited selectively at each of the defective portions of the solar cell element. The repaired solar cell element was subjected to heat treatment at 200° C. for an hour.

On the semiconductor layer 102 of the solar cell element there was then formed an 800 Å thick In$_2$O$_3$ film as the transparent conductive layer 103 by an electron beam evaporation method. On the transparent conductive layer 103 there was next formed a negative pattern mask comprising a photosensitive resin for the formation of a collecting electrode, followed by formation of a 400 Å thick Cr-film, a 10,000 Å thick Ag-film, and a 200 Å thick Cr-film as the collecting electrode 104 by an electron beam evaporation method.

Thus, there was obtained a repaired amorphous silicon solar cell.

Separately, there was prepared a comparative solar cell by repeating the above procedures, except for not performing the electrolytic process of depositing the MnO$_2$ insulating material.

Each of the resultant solar cells was evaluated with respect to short circuit current output. As a result, it was found that the solar cell obtained in this example surpasses the comparative solar cell by about 18%.

In addition, whether or not each of the solar cell obtained in this example and the comparative solar cell is accompanied by defective portions was observed in the same manner as in Example 1.

As a result, it was found that the number of defective portions of the solar cell obtained in this example is 1/6,000 that of the comparative solar cell.

From the results obtained in Examples 1 to 3, it was found that the process according to the present invention makes it possible to efficiently produce a defect-free photoelectric conversion device which exhibits desirable characteristics without having short circuits.

EXAMPLE 4

In this example, there was prepared a defect-free nip junction amorphous silicon germanium solar cell device of the configuration shown in FIG. 2.

Firstly, there was provided a stainless steel plate of 100 mm × 100 mm in size and 1.0 mm in thickness as the conductive substrate 200. This stainless steel plate was well cleaned in a cleaning vessel.

On the cleaned stainless steel plate as the conductive substrate 200 there was formed an about 0.5 $\mu$m thick aluminum film as the lower electrode 20 by a sputtering method. Successively, an about 0.4 $\mu$m thick nip junction amorphous silicon germanium semiconductor layer 202 was formed on the previously formed lower electrode 201 by a plasma CVD method. Then, on the nip junction amorphous silicon germanium semiconductor layer thus formed there was formed an about 0.07 $\mu$m thick ITO transparent and conductive thin film as the upper electrode 203 by a vacuum evaporation method. In this way, there was prepared a plurality of nip junction amorphous silicon germanium solar cell elements.

For each of the resultant nip junction amorphous silicon germanium solar cell elements, its current/voltage characteristics in a dark state were examined by a conventional method. As a result, more than twenty of the nip junction amorphous silicon germanium solar cell elements thus obtained did not exhibit diode characteristics as expected. From this result, it was found that these nip junction amorphous silicon germanium solar cell elements each have one or more defective portions as shown in FIG. 5(a).

Thus, twenty of those defective nip junction amorphous silicon germanium solar cell elements were randomly selected. Each of them was subjected to repairing treatment in the same manner as Example 1. That is, the defective nip junction amorphous silicon germanium solar element was immersed in the electrolytic etching solution 507, comprising an aqueous solution of AlCl$_3$ contained in the electrolytic vessel shown in FIG. 6, in which a platinum electrode as the counter electrode 508 was immersed. The conductive substrate 200 was made a cathode, whereas the platinum electrode was made an anode. The D.C. power source was switched on to apply a direct current voltage of 3 V between the two electrodes, whereby the corresponding portions of the transparent conductive layer 203 under which defective portions were present were reduced to dissolve into the electrolytic etching solution 507' (see FIG. 5(b)). Thereafter, a magnetic rubber was disposed to the resultant etched solar cell element such that it covered not only the rear face but also the opposite side faces of the conductive substrate 200. The result was immersed in the electrolytic solution 507 comprising a solution of tetrabutylammonium perchlorate in acetonitrile contained in the electrolytic vessel 511 shown in FIG. 4 in which a platinum electrode as the counter electrode 508 was immersed. The conductive substrate 200 was made an anode, whereas the platinum electrode was made a cathode. The D.C. power source was switched on to apply a direct current voltage of 5.0 V with a current density of 5 mA/cm$^2$ between the two electrodes, whereby a polymer film was deposited selectively at each of the defective portions. Then, the conductive substrate 200 was made a cathode, whereas the platinum electrode was made an anode, wherein the D.C. power source was switched on to apply a direct current between the two electrodes to thereby release anions from the respective polymer films deposited.

The twenty defective nip junction amorphous silicon germanium solar cell elements were thus repaired. For each of the resultant twenty nip junction amorphous silicon germanium solar cell elements thus repaired, the current/voltage characteristics in a dark state were examined. As a result, it was found that each of the twenty repaired nip junction amorphous silicon germanium solar cell elements exhibited desirable diode characteristics. And each of the twenty repaired nip junction amorphous silicon solar cell elements was found to have been repaired in a desirable state.

On the ITO conductive and transparent upper electrode layer 203 of each of the twenty repaired nip junction amorphous silicon germanium solar cell elements there was formed an about 1.0 $\mu$m thick Ag-film as the collecting electrode 204 by a vacuum evaporation method, to thereby obtain twenty nip junction amorphous silicon solar cell devices.

Each of the resultant twenty nip junction amorphous silicon solar cell devices was found to have been repaired in a desirable state as shown in FIG. 5(c).

For each of the resultant, the current/voltage characteristics in a dark state were examined. As a result, it was found that each of the resultant twenty nip junction amorphous silicon germanium solar cell devices is satisfactory in current/voltage characteristics.

Further, each of the resultant twenty nip junction amorphous silicon germanium solar cell devices was allowed to stand outdoors for two months. Its current-/voltage characteristics in a dark state were then examined. As a result, nineteen of the twenty solar cell devices were still satisfactory in current/voltage characteristics.

Each of the twenty nip junction amorphous silicon germanium solar cell devices was subjected to measurement of photoelectric conversion efficiency under irradiation of AM 1.5 light.

As a result, it was found that the foregoing nineteen nip junction amorphous silicon solar cell devices provide a satisfactory photoelectric conversion efficiency of more than 10%.

EXAMPLE 5

In this example, there was prepared a defect-free nip junction amorphous silicon germanium solar cell device of the configuration shown in FIG. 1.

Firstly, there was provided a stainless steel plate of 100 mm × 100 mm in size and 1.0 mm in thickness as the conductive substrate 100. This stainless steel plate was well cleaned in a cleaning vessel.

On the cleaned stainless steel plate as the conductive substrate 100 there was formed an about 5000 Å thick Mo-film as the lower electrode 101 by a sputtering method. Next an about 4000 Å thick nip junction amorphous silicon germanium semiconductor film as the semiconductor layer 102 was formed on the previously formed lower electrode 101 by a plasma CVD method.

In this way, there were prepared a plurality of partially fabricated nip junction amorphous silicon germanium solar cell elements.

For each of the resultant partially fabricated nip junction amorphous silicon germanium solar cell elements, the surface potential was observed by a conventional non-contact surface-potential measuring method using an electrostatic surface voltmeter. As a result, for more than twenty of the partially fabricated nip junction amorphous silicon germanium solar cell elements, the surface potential could not be measured. From this result, it was found that these partially fabricated nip junction amorphous silicon germanium solar cell elements have one or more defective portions as shown in FIG. 3(a).

Thus, twenty of those defective partially fabricated pin junction amorphous silicon germanium solar cell elements were randomly selected. The twenty defective partially fabricated pin junction amorphous silicon germanium solar cell elements were repaired in the same manner as in Example 2. That is, for each of them, an acetylcellulose film was disposed such that it covered not only the rear face but also the opposite side faces of the conductive substrate 100.

Each of the resultants was immersed in an electrolytic solution 507 comprising an aqueous solution of a water soluble carboxylic paint contained in the electrolytic vessel 51, in which a platinum electrode as the counter electrode 508 was immersed. The Mo-lower electrode 101 was made an anode, whereas the platinum electrode was made a cathode. The D.C. power source was switched on to apply a direct current voltage of 40 V between the two electrodes, whereby an insulating paint was deposited selectively at each of the defective portions (see, FIG. 3(b)).

The twenty partially fabricated defective nip junction amorphous silicon germanium solar cell elements were thus repaired. For each of the resultant twenty nip junction amorphous silicon germanium solar cell elements thus repaired, a 700 Å thick ZnO transparent and conductive film as the upper electrode 03 was formed on the nip junction semiconductor layer 02. Thus, there were obtained twenty repaired nip junction amorphous silicon germanium solar cell elements.

On the ZnO conductive and transparent layer as the upper electrode 103 of each of the twenty repaired nip junction amorphous silicon germanium solar cell elements there was applied a Ag-paste by means of a screen printing technique to thereby form a collecting electrode 104 as shown in FIG. 3(c), to thereby obtain twenty nip junction amorphous silicon germanium solar cell devices.

Each of the resultant twenty nip junction amorphous silicon germanium solar cell devices was found to have been repaired in a desirable state as shown in FIG. 3(c).

For each of the resultants, the current/voltage characteristics in a dark state were examined. As a result, it was found that each of the resultant twenty nip junction amorphous silicon germanium solar cell devices is satisfactory in current/voltage characteristics.

Further, each of the resultant twenty nip junction amorphous silicon germanium solar cell devices was allowed to stand outdoors for two months. Then, the current/voltage characteristics in a dark state were examined. As a result, nineteen of the twenty solar cell devices were still satisfactory in current/voltage characteristics.

Each of the twenty nip junction amorphous silicon germanium solar cell devices was subjected to measurement of photoelectric conversion efficiency under irradiation of AM 1.5 light.

As a result, it was found that the foregoing nineteen nip junction amorphous silicon solar cell devices provided a satisfactory photoelectric conversion efficiency of more than 10%.

EXAMPLE 6

In this example, there was prepared a defect-free nip junction amorphous silicon germanium solar cell device of the configuration shown in FIG. 2.

Firstly, there was provided a stainless steel plate of 100 mm × 100 mm in size and 1.0 mm in thickness as the conductive substrate 200. This stainless steel plate was well cleaned in a cleaning vessel.

On the cleaned stainless steel plate as the conductive substrate 200 there was formed an about 5000 Å thick Mo-film as the lower electrode 20 by a sputtering method. Successively, an about 4000 μ thick nip junction amorphous silicon germanium semiconductor layer 202 was formed on the previously formed lower electrode 201 by a plasma CVD method. Then, on the nip junction amorphous silicon germanium semiconductor layer thus formed there was formed an about 700 Å thick ZnO transparent and conductive thin film as the upper electrode 203 by a sputtering method. In this way, there were prepared a plurality of nip junction amorphous silicon germanium solar cell elements.

For each of the resultant nip junction amorphous silicon germanium solar cell elements, its current/voltage characteristics in a dark state were examined by a conventional method. As a result, more than twenty of the nip junction amorphous silicon germanium solar cell elements thus obtained did not exhibit diode characteristics as expected. From this result, it was found that each of these nip junction amorphous silicon germanium solar cell elements has one or more defective portions as shown in FIG. 5(a).

Twenty of those defective nip junction amorphous silicon germanium solar cell elements were randomly selected. Each of them was subjected to repairing treatment in the same manner as in Example 1. That is, the defective nip junction amorphous silicon germanium solar cell element was immersed in the electrolytic etching solution 507' comprising an aqueous solution of $AlCl_3$ contained in the electrolytic vessel 511 shown in FIG. 5, in which a platinum electrode as the counter electrode 508 was immersed. The conductive substrate 200 was made a cathode, whereas the platinum electrode was made an anode. The D.C. power source was switched on to apply a direct current voltage of 3 V between the two electrodes, whereby the corresponding portions of the transparent and conductive layer 203 under which defective portions were present were reduced to dissolve into the electrolytic etching solution 507' (see FIG. 5(b)). Thereafter, a magnetic rubber was disposed on the resultant etched solar cell element such that it covered not only the rear face but also the opposite side faces of the conductive substrate 200. The resultant was immersed in the electrolytic solution 507 comprising an aqueous solution of a water soluble carboxylic paint contained in the electrolytic vessel 511 shown in FIG. 4, in which a platinum electrode as the counter electrode 508 was immersed. The Mo lower electrode 201 was made an anode, whereas the platinum electrode was made a cathode. The D.C. power source was switched on to apply a direct current voltage of 4.0 V between the two electrodes, whereby an insulating paint was deposited selectively at each of the defective portions.

The twenty defective pin junction amorphous silicon germanium solar cell elements were thus repaired. For each of the resultant twenty pin junction amorphous silicon germanium solar cell elements thus repaired, the current/voltage characteristics in a dark state were examined. As a result, it was found that each of the twenty repaired pin junction amorphous silicon germanium solar cell elements exhibited desirable diode characteristics. And each of the twenty repaired nip junction amorphous silicon germanium solar cell elements was found to have been repaired in a desirable state.

On the ZnO conductive and transparent layer as the upper electrode 203 of each of the twenty repaired nip junction amorphous silicon germanium solar cell elements there was formed a collection electrode 204 by applying a Ag.paste by means of screen printing technique. Thus, there were obtained twenty pin junction amorphous silicon germanium solar cell devices.

Each of the resultant twenty nip junction amorphous silicon germanium solar cell devices was found to have been repaired in a desirable state as shown in FIG. 5(c).

For each of the resultants, the current/voltage characteristics in a dark state were examined. As a result, it was found that each of the resultant twenty pin junction amorphous silicon germanium solar cell devices was satisfactory in current/voltage characteristics.

Further, each of the resultant twenty nip junction amorphous silicon germanium solar cell devices was allowed to stand outdoors for two months. Then, the current/voltage characteristics in a dark state were examined. As a result, nineteen of the twenty solar cell devices were still satisfactory in current/voltage characteristics.

Each of the twenty nip junction amorphous silicon germanium solar cell devices was subjected to measurement of photoelectric conversion efficiency under irradiation of AM 1.5 light.

As a result, it was found that the foregoing nineteen nip junction amorphous silicon germanium solar cell devices provided a satisfactory photoelectric conversion efficiency of more than 10%.

What is claimed is:

1. A process for producing a photoelectric conversion device, comprising the steps of (a) forming a semiconductor layer on a conductive surface of a substrate, (b) forming a transparent and conductive layer on said semiconductor layer, and (c) forming a collecting electrode on said transparent and conductive layer, characterized in that said process includes a step of repairing one or more defective portions occurring at or in said semiconductor layer between said step (a) and said step (b), by subjecting said semiconductor layer to an electro-deposition processing in an electrolytic solution containing a charged paint or a charged resin capable of providing a deposit of an insulating material, wherein said conductive surface of the substrate is made to be an electrode for said electro-deposition processing, whereby depositing said insulating material selectively at each of said defective portions.

2. The process according to claim 1, wherein said charged paint or said charged resin contained in said electrolytic solution is insulating and is in the form of fine particles, and said electrolytic solution further contains a surfactant.

3. A process for producing a defect-free photoelectric conversion device, comprising the steps of (a) forming a semiconductor layer on a conductive surface of a substrate, (b) forming a transparent and conductive layer on said semiconductor layer, and (c) forming a collecting electrode on said transparent and conductive layer, characterized in that said process includes a step of repairing one or more defective portions occurring at or in said semiconductor layer between said step (b) and said step (c), by subjecting said transparent and conductive layer to an electrolytic etching treatment in an electrolytic etching solution wherein said conductive surface of the substrate is made to be an electrode, thereby removing parts of said transparent and conductive layer under which said one or more defective portions occurred at or in said semiconductor layer to obtain a selectively etched product; and subjecting said selectively etched product to an electro-deposition processing in an electrolytic solution containing a charged paint or a charged resin capable of providing a deposit of an insulating material, wherein said conductive surface of the substrate is made to be an electrode for said electro-deposition processing, thereby depositing said insulating material selectively at each of said defective portions.

4. The process according to claim 3, wherein said charged paint or said charged resin contained in said electrolytic solution is insulating and is in the form of fine particles, and said electrolytic solution further contains a surfactant.

* * * * *

UNITED STATES PATENT AND TRADEMARK OFFICE
CERTIFICATE OF CORRECTION

PATENT NO. : 5,277,786
DATED : January 11, 1994
INVENTOR(S) : SOICHIRO KAWAKAMI

It is certified that error appears in the above-identified patent and that said Letters Patent is hereby corrected as shown below:

COLUMN 2

Line 18, "obviating" should read --eliminating--.

COLUMN 3

Line 64, "for" should read --with--.

COLUMN 4

Line 6, "required" should read --required,--.
Line 34, "process;" should read --scanning process;--.

COLUMN 6

Line 8, "layer 1" should read --layer 11--.
Line 25, "strate 0" should read --strate 10--.
Line 29, "substrate 0" should read --substrate 10--.
Line 30, "cell 4." should read --cell 14.--.
Line 39, "layer 2" should read --layer 12--.
Line 44, "$8H^+2e^-$" should read --$8H^++2e^-$--.
Line 46, "$Sn^2+2H_2O$" should read --$Sn^{2+}+2H_2O$--.

COLUMN 7

Line 19, "electrode 3" should read --electrode 13--.

COLUMN 8

Line 10, "portions" should read --defective portions--.

UNITED STATES PATENT AND TRADEMARK OFFICE
CERTIFICATE OF CORRECTION

PATENT NO. : 5,277,786
DATED : January 11, 1994
INVENTOR(S) : SOICHIRO KAWAKAMI

It is certified that error appears in the above-identified patent and that said Letters Patent is hereby corrected as shown below:

COLUMN 10

Line 30, "a" (second occurrence) should read --an--.
    Line 45, "numeral 10" should read --numeral 101--.
    Line 48, "later" should read --layer--.
    Line 67, "indicates 200" should read --numeral 200--.

COLUMN 11

Line 9, "numeral" (second occurrence) should be deleted.
    Line 11, "layer 20" should read --layer 201--.
    Line 15, "layer 20" should read --layer 201--.
    Line 26, "or 106," should read --or 106',--.
    Line 41, "electrode 20" should read --electrode 201--.

COLUMN 12

Line 9, "when" should read --for--.
    Line 21, "method" (second occurrence) should read --method,--.

COLUMN 13

Line 18, "occurred" should read --formed--.
    Line 30, "material 06" should read --material 106--.

COLUMN 14

Line 28, "corrosion" should read --corrosion- --.
    Line 35, "cess" should read --cess,--.
    Line 61, "FIG. 5(a)" should read --FIG. 5(a),--.

UNITED STATES PATENT AND TRADEMARK OFFICE
CERTIFICATE OF CORRECTION

PATENT NO.  : 5,277,786
DATED       : January 11, 1994
INVENTOR(S) : SOICHIRO KAWAKAMI It is certified that error appears in the above-identified patent and that said Letters Patent is hereby corrected as shown below:

COLUMN 15

Line 62, "situation" should read --situated--.

COLUMN 16

Line 27, "contained" should read --containing--.
Line 31, "layer 20" should read --layer 201--.
Line 47, "vessel 51" should read --vessel 511--.

COLUMN 18

Line 27, "there" should be deleted.
Line 59, "trode 10" should read --trode 101--.
Line 60, "layer 10" should read --layer 101--.
Line 61, "layer 02" should read --layer 102--.
Line 63, "disposed" should read --was disposed--.

COLUMN 19

Line 2, "51" should read --511--.
Line 56, "electrode 20" should read --electrode 201--.

COLUMN 20

Line 15, "solution 507," should read --solution 507',--.
Line 67, "resultant," should read --resultants,--.

COLUMN 21

Line 31, "Next" should read --Next,--.
Line 63, "vessel 51," should read --vessel 511,--.

UNITED STATES PATENT AND TRADEMARK OFFICE
CERTIFICATE OF CORRECTION

PATENT NO.   :   5,277,786
DATED        :   January 11, 1994
INVENTOR(S)  :   SOICHIRO KAWAKAMI It is certified that error appears in the above-identified patent and that said Letters Patent is hereby corrected as shown below:

COLUMN 22

Line 8, "electrode 03" should read --electrode 103--.
    Line 9, "layer 02." should read --layer 102.--.
    Line 54, "electrode 20" should read --electrode 201--.
    Line 55, "4000 µ" should read --4000 Å--.

COLUMN 23

Line 15, "5," should read --6,--.
    Line 53, "collection" should read --collecting--.
    Line 54, "Ag.paste" should read --Ag-paste--.

COLUMN 24

Line 29, "whereby" should read --thereby--.

Signed and Sealed this

Eleventh Day of October, 1994

Attest:

BRUCE LEHMAN

Attesting Officer    Commissioner of Patents and Trademarks